United States Patent [19]

Chaudhari et al.

[11] 4,341,942
[45] Jul. 27, 1982

[54] METHOD OF BONDING WIRES TO PASSIVATED CHIP MICROCIRCUIT CONDUCTORS

[75] Inventors: Praveen Chaudhari, Briarcliff Manor; John B. Kiessling; David J. Perlman, both of Wappingers Falls; Eugene E. Tynan, Mahopac Falls; Robert J. von Gutfeld, New York, all of N.Y.

[73] Assignee: International Business Machines Corporation, Armonk, N.Y.

[21] Appl. No.: 157,628

[22] Filed: Jun. 6, 1980

Related U.S. Application Data

[63] Continuation of Ser. No. 956,158, Oct. 31, 1978.

[51] Int. Cl.³ .............................................. B23K 27/00
[52] U.S. Cl. ....................... 219/121 LD; 219/121 LC; 219/121 LF; 219/121 LL
[58] Field of Search ..... 219/121 L, 121 LM, 121 LC, 219/121 LD, 121 LA, 121 LH, 121 LJ, 121 LN, 121 LK, 121 LL, 121 LF, 121 EB, 121 EM, 121 EC, 121 ED, 121 EH, 121 EJ, 121 EK

[56] References Cited

U.S. PATENT DOCUMENTS

| | | | |
|---|---|---|---|
| Re. 27,772 | 10/1973 | Hanfmann | 219/121 LM |
| 2,902,583 | 9/1959 | Steigerwald | 219/121 EM |
| 3,294,951 | 12/1966 | Olson | 219/121 EM |
| 3,304,403 | 2/1967 | Harper | 219/121 L |
| 3,384,526 | 5/1968 | Abramson et al. | 219/121 L X |
| 3,404,253 | 10/1968 | Anderson et al. | 219/121 LA X |
| 3,520,055 | 7/1970 | Jannett | 219/121 EM |
| 3,562,009 | 2/1971 | Cranston et al. | 219/121 EM |
| 3,585,350 | 6/1971 | Voytko | 219/121 LA X |
| 3,592,996 | 7/1971 | Sayer | 219/121 EM |
| 4,028,523 | 6/1977 | Anderl et al. | 219/121 LM |

OTHER PUBLICATIONS

Cook et al., "Chip Personalization by Short Laser Pulses", IBM Tech. Disc. Bull., vol. 17, No. 1, Jun., 1974, p. 242.
Chang et al., "Personalizing Prepackaged Semiconductor Devices", IBM Tech. Disc. Bull., vol. 17, No. 7, Dec., 1974, pp. 1950–1951.
Scheuerlein, "Joining Metal Lines with a Laser Beam Tool", IBM Tech. Disc. Bull., vol. 21, No. 3, Aug., 1978, pp. 1027–1028.
Charschan et al., *Lasers in Industry*, Van Nostrand Reinhold Company, 1972, p. 203.

*Primary Examiner*—C. L. Albritton
*Attorney, Agent, or Firm*—Yen S. Yee

[57] ABSTRACT

A wire is positioned in intimate contact with a microcircuit chip above a conductor line or pad on the chip. The line is protected by a layer of passivating or insulating material deposited upon the chip. A short pulse, focussed, energy source such as a laser beam drills a hole through or on the edge of the wire, and also opens a hole drawn through the insulating material to expose the conductor line. Then energy is directed upon the portion of the wire surrounding the hole to melt metal from the wire down into the hole which coalesces with molten metal below to form an electrical and mechanical bond of the wire to the line.

12 Claims, 8 Drawing Figures

METHOD OF BONDING WIRES TO PASSIVATED CHIP MICROCIRCUIT CONDUCTORS

This is a continuation of application Ser. No. 956,158 filed Oct. 31, 1978.

DESCRIPTION

1. Technical Field

This invention relates to metal working and more particularly to joining of semiconductor or other electronic devices to wires by means of a focussed high energy beam.

2. Background Art

U.S. Pat. No. 3,485,996 of Chiou et al shows a metal lead secured to the bottom of a polyimide transparent film (decal) which holds it in place to some degree. A focussed ruby laser beam is directed through the transparent backing upon the metal as it overlies the lands on a chip to weld the two layers of metal together. There was no insulation involved.

Kuhn et al "Experimental Study of Laser Formed Connectors for LSI Wafer Personalization", IEEE Journal of Solid State Circuits, Vol. SC-10, No. 4, 219–229 (July 1975) shows use of 2–6 ns Rhodamine 6G dye solution laser pulses to weld a 1 micrometer (micron) upper layer of aluminum. The aluminum is deposited upon a 2 micron thick sputtered $SiO_2$ film resting on a lower 1 micron thick aluminum film, producing a contact having a resistance of 1 ohm prior to annealing which reduces to 0.3 ohm subsequent to annealing.

U.S. Pat. No. Re 27,772 of Hanfmann entitled, "Method of Manufacturing Thin Film Components" describes use of lasers to adjust resistance value by drilling holes to reduce resistance value by removing a part of a resistive film or to increase resistance value by creating a shunt connection of a second resistor in parallel with the first resistor. A laser pulse of high intensity and short duration as shown in FIG. 9 generates an "open hole" (FIGS. 5 and 6) which removes part of the lower film 22 of resistive material. A longer but less intense pulse creates a "shunt hole" (FIGS. 7 and 8), which connects the upper resistive film in parallel with the lower film by melting part of the upper film down through the insulating material in which a hole is drilled to bond the two films together.

Cook et al, IBM TDB, 17, 242 (1974) teaches connecting an aluminum metallization line deposited upon a chip as a thin film with an underlying P-type conductivity diffusion region in a Si substrate by a series of laser pulses 8 nanoseconds or shorter, removing Al and causing Si to well up through the dielectric. The differences are: (1) that the wire here is separate from the chip and is simply resting loosely on top of it, (2) that the dimensions involved here are far smaller than in 1974, though there were none mentioned by Cook et al, (3) a connection is being made externally of a previously manufactured chip which is not analogous to Cook et al, (4) the first pulses are drilling pulses of high intensity. Later pulses are for bonding and are less intense.

Myers et al, IBM TDB, 20, 1324 (1977) shows another way to make connections, which would not be effective for this purpose since it is limited to making connections to chip plugs on the exterior where the chip has been omitted from the card. This is basically not relevant except for the fact that it uses micro-surface welding of wires about three times larger than those involved here. Also it does not make any new connection points to a chip which were not provided by the original manufacturing process. The technique of this invention, on the other hand, permits such internal connections to be made.

U.S. Pat. No. 3,718,968 of Sims et al teaches laser bonding of a wire to a component or substrate.

U.S. Pat. No. 3,402,460 also shows laser welding of a lead 28 directly to a P- or N-type region.

Magdo, IBM TDB, 19, 1217 (1976) teaches using a laser beam to make an engineering change on the metal lines on a module to which a chip is secured or directly on the chip. It requires use of upper pads on the chip for rewiring and does not show how to connect wiring to the thin metallization.

Chang et al, IBM TDB, 17, 1950-1 (1974) shows metal-to-metal connection by laser drilling on a passivated chip.

Other U.S. patents include U.S. Pat. Nos. 3,303,319, 2,902,583, and 3,431,389, which pertain to electron and charged particle beam cutting, drilling and vaporization methods and apparatus.

DISCLOSURE OF THE INVENTION

Figure 1:
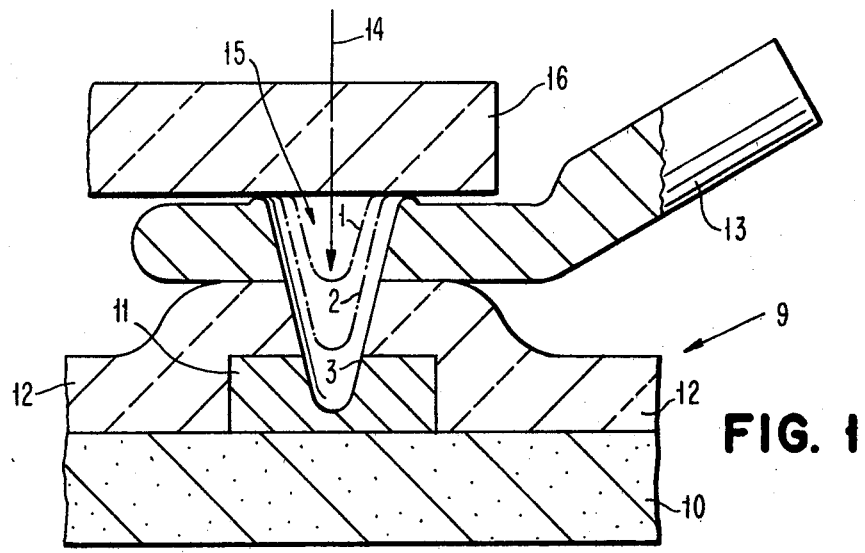
FIG. 1 shows a sectional view of a procedure for laser tacking of a wire to a thin film conductor deposited upon a substrate and covered by a thin passivation layer.

FIG. 1 shows a fragment of a chip 9 including a substrate 10 of considerable thickness (which is shown as being thin for convenience of illustration). Substrate 10 can be a silicon chip, for example. A thin film conductor 11 of a metal such as Al, etc. is shown deposited upon silicon as is useful in the case of device interconnection. The conductor 11 may be about 5–10 micrometers wide and 0.3–0.5 micrometers thick, for example. Above conductor 11 is deposited a thin passivation layer 12 composed of a material such as SiO or $SiO_2$. In certain cases it would be desirable to make a connection of a wire such as wire 13 to the conductor 11 which may be about 10 micrometers in diameter. Wire 13 is shown clamped in position by an ordinary glass slide 16.

A need to make such connections can arise when it is desired to test parts of a circuit, for fault repair or for general characterization of the circuit in a way which could not have been provided for in advance. Making of welds of small dimensions is especially important in the kinds of circumstances in which low AC inductance and capacitance are required. Probes capable of probing such small devices of random geometries have high inductances and capacitances, which make them unsuitable for such use.

When passivated aluminum lines are deposited upon a typical substrate such as silicon, two factors have caused connection problems heretofore. First, the silicon dioxide passivation layer interacts with the aluminum conductor 11 when they are heated to cause oxygen to combine with some of the aluminum which prevents good electrical and mechanical bonding. Brittle insulating layers form. Secondly, when an aluminum conductor 11 which is not covered with a passivation layer 12 is heated to provide a bond, the exposed aluminum surface is oxidized to some degree which similarly interferes with formation of a good electrical and mechanical bond. In any event, it is clear that in order to provide a good connection between a wire 13 and a conductor 11, the oxide passivation 12 must be removed above the conductor 11 to provide a surface on conductor 11 to which a proper electrical and mechanical bond can be made. The problem is how to achieve such a connection without exposing the metal of conductor 11 to oxidation.

As is shown in FIG. 1, this invention includes application of highly focussed electromagnetic energy in the form of a laser beam 14 to remove the passivation material substantially instantly and explosively so that oxidation cannot occur. The technique involves drilling a hole 15 through wire 13, passivation layer 12 and a portion of layer 11 by pulsing a laser beam 14 in such a way that successive laser pulses numbered 1, 2, and 3 in FIG. 1 drill even deeper through the wire 13 (pulse #1), through passivation layer 12 (pulse #2) and into conductor 11 (pulse #3). We have found that the material removed is ejected violently from the hole 15. It is also hypothesized that the process causes a breakdown of oxides and thus the process enhances formation of low resistance welds and bonds. We found that the tacking process described above yields a relatively high electrical resistance 20,000-30,000 ohm connection which provides fairly poor mechanical connection between the wire 13 (gold, aluminum, etc.) and the conductor 11 (aluminum, etc.). However, we believe that the tacking is accomplished with little oxide present in the connection to the conductors 11.

Subsequently, we experimented further and discovered a key fact. We have found that after the hole has been drilled as shown in FIG. 1, if the laser beam is adjusted (i.e., defocussed, etc.) to provide a lower energy laser beam directed more at the periphery of hole 15 and just hot enough to melt metal from wire 13 down into hole 15, the additional molten metal pouring into the hole and molten metal from below coalesce to provide an enhanced mechanical and electrical connection with a resistance of less than 10 ohms. Thus, the process of FIG. 1 serves to tack the wire in place and the subsequent melting of the metal at a lower, less explosive temperature causes metal to flow down into the hole 15 and coalesce with molten metal below.

Figure 2:
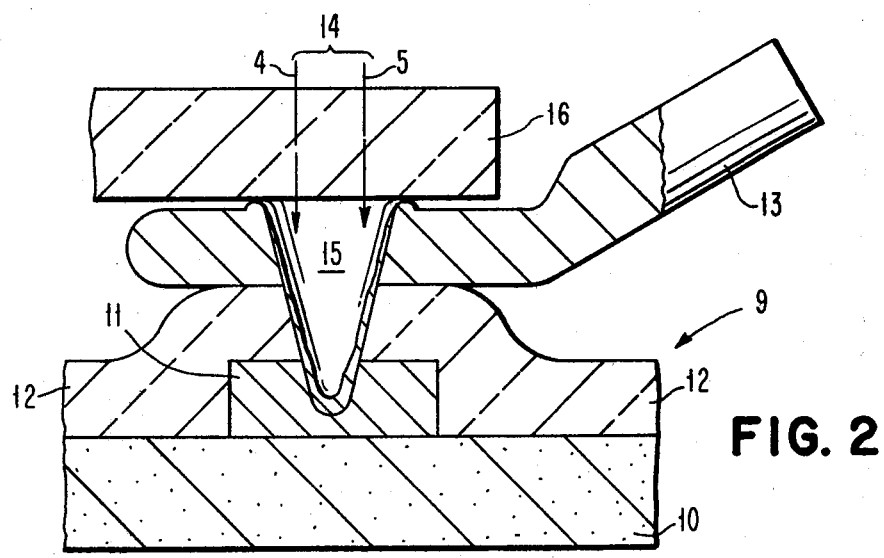
FIG. 2 shows a sectional view of the product of FIG. 1 after further laser bonding of the wire to the conductor.

The latter step of melting the metals together is illustrated in a slightly different fashion in FIG. 2 which shows subsequent pulses #4 and #5 of lesser intensity directed to opposite sides of hole 15 to melt metal from the left and then the right down into the hole 15 and to heat the metal of conductor 11 below. Pulses #4 and #5 are aimed as shown in FIG. 2 slightly in from the edge of hole 15. We believe that pulses #4 and #5 or the like provide a wider region of contact and a substantially lower impedance, but primarily in the preformed hole 15 which is an oxide-free region.

Figure 3:
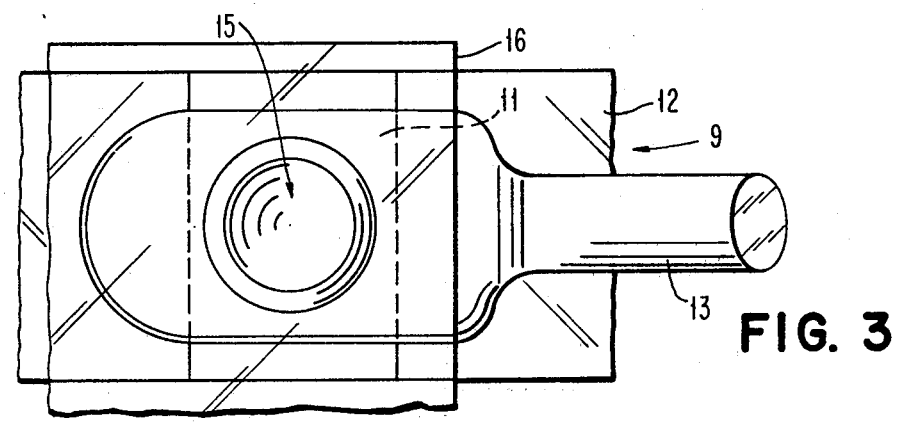
FIG. 3 shows a plan view of FIG. 2.

A laser beam 14 from a single source can be used for both the steps of FIG. 1 and the lower intensity steps exemplified by FIGS. 2 and 3, if the laser beam in the latter set of pulses is defocussed or reduced in intensity to reduce the amount of energy per unit area reaching down into hole 15 to avoid further drilling of metal 11 or 13. A short pulsed laser of a $5 \times 10^{-9}$ sec. pulse width such as a nitrogen pumped dye laser has been employed successfully. The laser must be capable of being focussed down to several microns. Other lasers such as a YAG, a frequency doubled YAG, and O-switched ruby lasers (which provide short intense pulses) can also be used. Xenon gas lasers in longer durations are also adequate at commensurately lower power per unit area or lower flux.

The wire 13 must be clamped, pressed, or prepressed in position by means such as glass slide 16 to prevent it from recoiling away from its position upon the chip 9. A practical way to provide a support for the wire would be to use a tool which could clamp ends of the wire. It is also possible to press a wire upon a chip and to remove the pressing tool prior to drilling and to achieve sufficient adhesion by using the pressing step. Thus, wire 13 does not usually recoil when using the latter procedure. Use of a glass clamp throughout the drilling and bonding process provides better results.

It has been found that when the tip of the wire 13 has been flattened as shown in FIG. 1, etc., the connection produced is improved. Also, when the wire has been flatted initially, the effectiveness of pressing the wire onto the chip 9 with a slide and subsequent removal of the slide prior to laser drilling is enhanced. If the laser drills through the metal 11, it is still possible to make an excellent bond. If it is required to avoid drilling lower than metal 11, it is possible to employ a narrow "window" of drilling for any specific application. Duration of pulses, power per unit area, etc. can be adjusted within this window, and trial and error tests will permit avoidance of excessive drilling.

Figure 4:
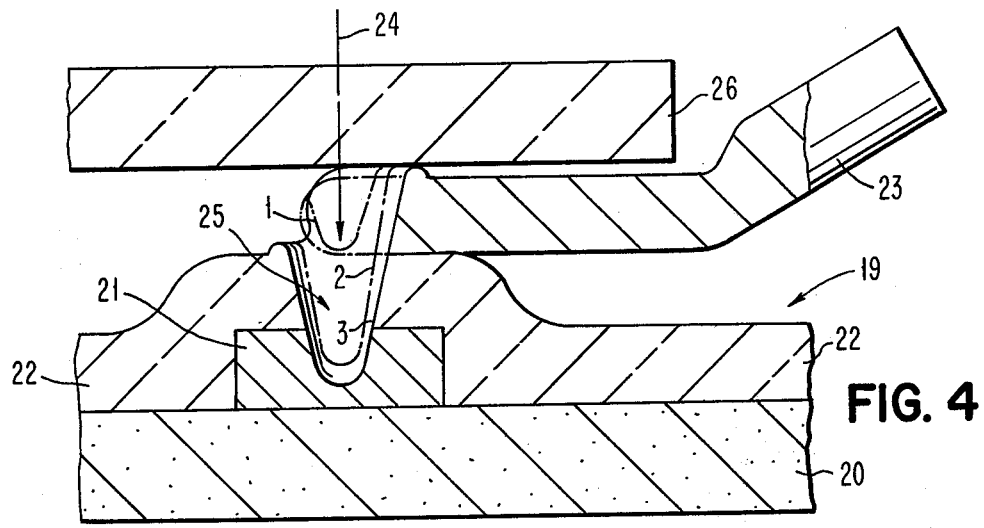
FIG. 4 shows a laser tacking procedure for connection to the end of a wire.

FIG. 4 shows laser bonding of a chip 19 to the end of a wire 23 where the substrate 20, conductor 21, passivation layer 22, wire 23 and slide 26 are identical. Laser beam 24 drills hole 25 in 3 pulses, for example.

Figure 5:
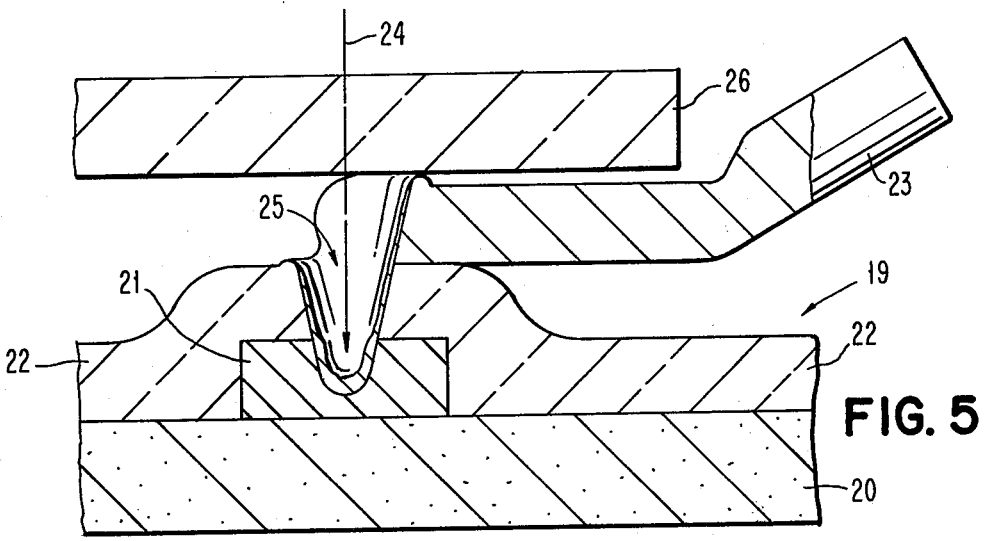
FIG. 5 shows the product of FIG. 4 after further laser bonding of the wire to the conductor.

FIG. 5 shows the result of exposing the wafer of FIG. 4 to further pulsing by a defocussed laser beam which melts the metals together, thereby providing reduced electrical resistance and improved mechanical connection.

Figure 6:
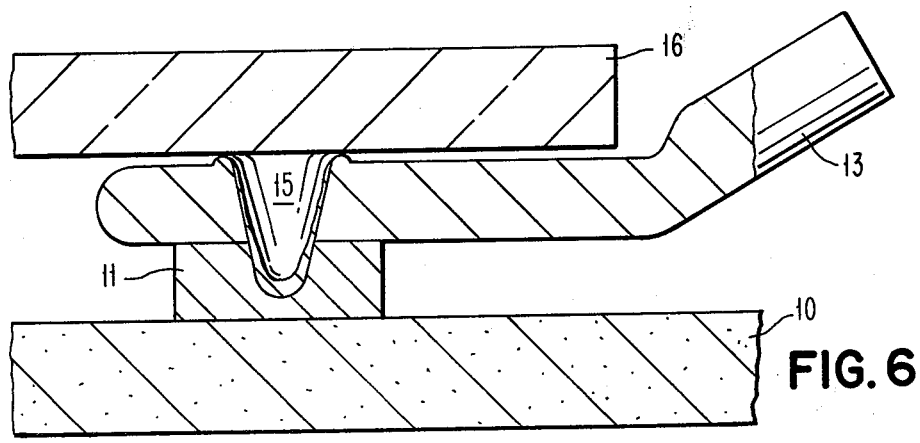
FIG. 6 shows a view similar to FIG. 2 with no intervening passivation layer.

FIG. 6 shows that a conductor on a chip without any passivation layer can be bonded to a wire by this technique.

SUMMARY

A wire is bonded to a thin film of metallization on an LSI microcircuit chip which is covered by insulation. Preferably, as a first step, the desired section or tip of the wire is flattened, and then the flattened section is positioned on top of the metallization to which it is to be bonded and pressed down upon the surface of the insulation. A laser beam of narrow diameter is directed to drill through the flattened section or tip of the wire and the insulation down to the metallization below the insulation. Then the laser beam is either defocussed slightly to provide a broader beam or is directed at the periphery of the previously drilled hole for the purpose of causing metal from wire to flow down into the drilled hole and/or up from the metallization below to form a low resistance electrical contact between the metallization and the wire. Alternatively, the reflow step is performed with a longer pulse width laser such as a Xenon laser, whereas a short pulse nitrogen pumped dye laser will drill readily.

The chip lead joining process involved here comprises the application of a relatively intense pulsed laser beam to drill a hole through an external metal lead clamped in position by means such as a glass slide or the like to prevent jumping of the wire and a layer of insulation below to melt some of a layer of metallization. Subsequently, pulsed laser beam energy is directed to a greater degree than before upon the metal around the drilled hole in the wire to melt it down into the hole and to melt metal below so the metals coalesce. The laser energy, if any, directed into the hole is at a lower energy level. This can be done by defocussing the beam or scanning about the hole.

Alternative Energy Sources

Figure 7:
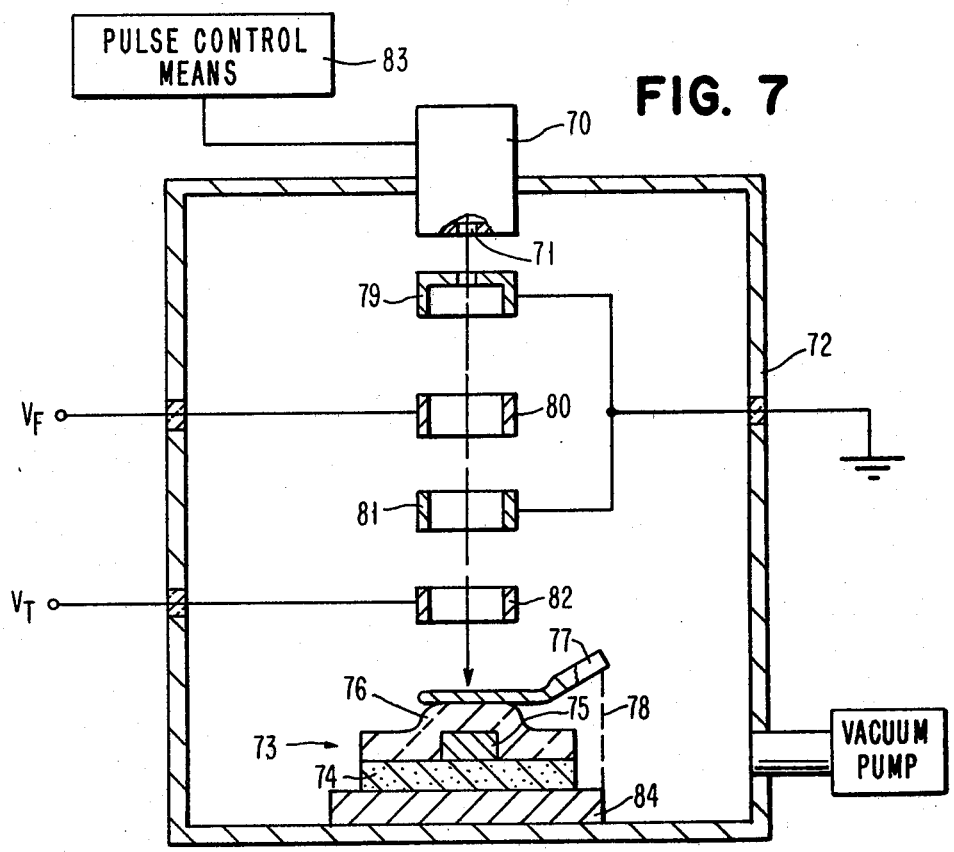
FIG. 7 shows an ion beam system for use to perform the method of this invention.

FIG. 7 shows an ion beam system for performing this invention. An ion source 70 generates a pulsed ion beam which is directed through aperture 71 into chamber 72 housing workpiece 73 with a substrate 74, thin film conductor 75, and passivation layer 76. A wire 77 is pressed down upon the workpiece without any external clamp, and it is supported by a member indicated by dotted line 78. An Einzel lens is formed by cylindrical elements 79, 80, and 81 which elements focus the ion beam. Elements 79 and 81 are grounded and element 80 is placed at the focussing voltage $V_F$ which is varied for drilling and "welding". A target voltage electrode 82 adjusts the energy of the beam as it strikes the work to provide drilling at higher voltages and melting of the metal for "welding" at lower voltages. Ion source 70 includes an extractor control which can turn the ion beam on and off. A pulse control means 83 is connected to the extractor control to pulse the ion beam on and off at the desired rate.

An x-y support 84 is provided for moving the work under the beam until it is properly aligned as will be indicated by a standard video system (not shown).

Alternatively, the drilling and welding operations can be performed by an electron beam drilling apparatus generally of the variety shown in U.S. Pat. Nos. 3,793,281 of Steigerwald which shows drilling by electrons and 3,644,700 of Krupp et al which shows means for deflecting electron beams, and 2,902,583.

Figure 8:
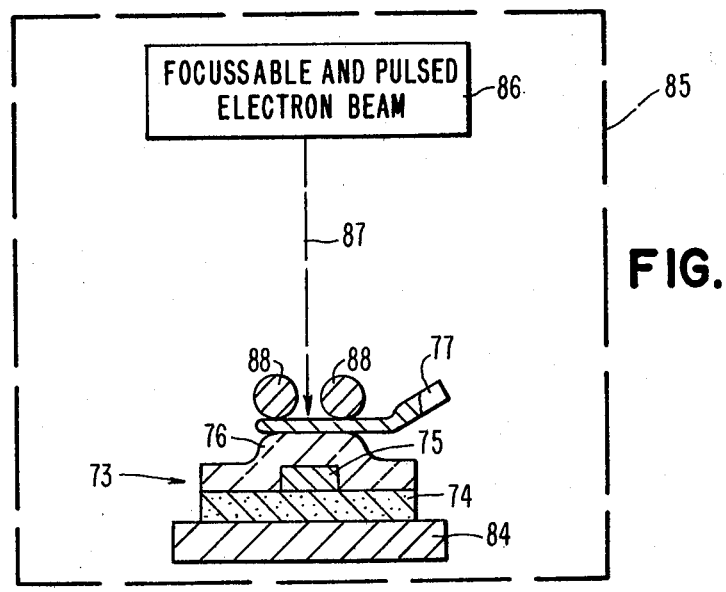
FIG. 8 shows an electron beam system adapted for use in connection with this invention.

A block diagram of the system is shown in FIG. 8 with enclosed chamber 85 including a focussed electron beam source 86 which can be pulsed in the conventional manner as in U.S. Pat. No. 2,902,583. The beam can also be defocussed to perform welding at a lower intensity per unit area of the beam, about the periphery of the hole. The work 73 is the same as in FIG. 7 except the work clamping fingers 88 have been shown as an alternative to slide 16 in FIG. 1.

Example of Laser Process

As an example of a laser drilling system, a 12 micron aluminum wire is drilled to form a 5 micron hole with a laser with a beam having about a $5 \times 10^9$ watts/cm$^2$ incident power density. The later melting of metal about the periphery of the hole is achieved with a beam having a reduced incident power density of about $2 \times 10^9$ watts/cm$^2$.

Industrial Applicability

This laser drilling and welding process is adapted to manufacturing small devices such as small circuit chips, circuit cards, modules, or Josephson devices.

Having thus described our invention, what we claim as new and desire to secure by Letters Patent is:

1. A method of bonding a separate metallic wire to a metallic conductor deposited upon a substrate and covered by an insulating layer comprising:
   positioning said wire upon said insulating layer above said conductor and mechanically retaining said wire in intimate contact with said insulating layer during a subsequent drilling step,
   directing an initial beam of predetermined energy at a point on said wire to drill a hole through said wire and said insulating layer to said conductor, and
   subsequently directing a subsequent beam of less energy than said initial beam upon the periphery of said hole in said wire only to melt metal from said wire down into said hole and to bond said wire to said conductor, whereby a low electrical resistance bond is provided between said wire and said conductor, said bond having enhanced mechanical strength and reduced electrical resistance as the result of melting metal down into said hole.

2. The method of claim 1, wherein a single source is utilized for both said initial and subsequent energy beam.

3. The method of claim 2, wherein said initial beam is focused and said subsequent beam is defocused.

4. A method in accordance with claim 1 including providing said subsequent beam by using the source of said initial beam and aiming it at the periphery of said hole for the purpose of causing metal from said wire to melt down into said hole.

5. A method in accordance with claim 4 including scanning of said subsequent beam about the periphery of said hole.

6. A method in accordance with claim 1, wherein at least one of said initial and subsequent beams is a laser beam.

7. A method in accordance with claim 1 wherein at least one of said initial and subsequent beams is an electron beam.

8. A method in accordance with claim 1 wherein at least one of said initial and subsequent beams is an ion beam.

9. A method in accordance with claim 1 wherein said wire is positioned upon said insulating layer by means of pressing said wire upon said insulating material.

10. A method in accordance with claim 5 wherein said pressing is provided by prepressing said conductor upon said insulating layer prior to drilling said hole.

11. A method in accordance with claim 5 wherein said pressing is provided by means for clamping said wire to said insulating layer during drilling of said wire.

12. A method of bonding a separate metallic wire to metallic conductor deposited upon a substrate and covered by an insulating layer comprising:
    positioning said wire upon said insulating layer above said conductor and mechanically retaining said wire in intimate contact with said insulating layer during a subsequent drilling step,
    directing an initial beam of predetermined energy at a point on said wire to drill a hole through said wire and said insulating layer to said conductor, and subsequently directing a subsequent beam of energy upon the periphery of said hole in said wire only to melt metal from said wire down into said hole and to bond said wire to said conductor, with said subsequent beam directing less power per unit area into said hole than said initial beam to prevent further drilling of said hole by said subsequent beam whereby a low electrical resistance bond is provided between said wire and said conductor, said bond having enhanced mechanical strength and reduced electrical resistance as the result of melting metal down into said hole.

* * * * *